(12) United States Patent
Makinson et al.

(10) Patent No.: US 8,212,687 B2
(45) Date of Patent: Jul. 3, 2012

(54) LOAD SIDE VOLTAGE SENSING FOR AMI METROLOGY

(75) Inventors: David N. Makinson, Seneca, SC (US);
Andrew Lancaster, Seneca, SC (US);
Scott Swanson, Walhalla, SC (US)

(73) Assignee: Itron, Inc., Liberty Lake, WA (US)

(*) Notice: Subject to any disclaimer, the term of this patent is extended or adjusted under 35 U.S.C. 154(b) by 1325 days.

(21) Appl. No.: 11/901,292

(22) Filed: Sep. 14, 2007

(65) Prior Publication Data

US 2008/0088297 A1    Apr. 17, 2008

Related U.S. Application Data

(60) Provisional application No. 60/845,057, filed on Sep. 15, 2006.

(51) Int. Cl.
*G08C 19/02* (2006.01)

(52) U.S. Cl. ........... 340/870.2; 340/870.01; 340/870.02; 324/110; 324/509; 324/519; 700/3; 700/22; 700/286; 700/295

(58) Field of Classification Search ............. 340/870.01, 340/870.02; 324/110; 700/3, 22, 286, 295
See application file for complete search history.

(56) References Cited

U.S. PATENT DOCUMENTS

| | | | |
|---|---|---|---|
| 4,799,062 A | 1/1989 | Sanderford, Jr. et al. | |
| 4,801,937 A * | 1/1989 | Fernandes | 340/870.16 |
| 4,977,577 A | 12/1990 | Arthur et al. | |
| 4,998,102 A | 3/1991 | Wyler et al. | |
| 5,067,136 A | 11/1991 | Arthur et al. | |
| 5,095,493 A | 3/1992 | Arthur et al. | |
| 5,119,396 A | 6/1992 | Snderford, Jr. | |
| 5,198,796 A | 3/1993 | Hessling, Jr. | |
| 5,265,120 A | 11/1993 | Sanderford, Jr. | |
| 5,297,016 A * | 3/1994 | Stephens et al. | 363/149 |
| 5,310,075 A | 5/1994 | Wyler | |

(Continued)

OTHER PUBLICATIONS

International Search Report for PCT International Application No. PCT/US2007/020151; search completed Jan. 18, 2008.

*Primary Examiner* — Brian Zimmerman
*Assistant Examiner* — Amine Benlagsir
(74) *Attorney, Agent, or Firm* — Dority & Manning, P.A.

(57) ABSTRACT

Disclosed are apparatus and methodologies for providing improved functionality of a meter in a 2-way communications arrangement, such as an Advanced Metering System (AMS) or Infrastructure (AMI). More particularly, the present technology relates to methodologies and apparatus for providing load side voltage sensing for utility meters which preferably are operable with remote disconnect features in an Advanced Metering Infrastructure (AMI) open operational framework. The present subject matter provides enhanced capabilities resulting in improved functionality, increased safety, and greater economy vis-à-vis fraud detection for individual metrology components in an open operational framework. Meters per the present subject matter utilize a detection circuit, which is situated generally downstream of a remote disconnect functionality. Such detection circuit is able to sense whether voltage exists or doesn't exist at such relatively downstream, or load side location. Providing such functionality allows for: (a) verification that a remote disconnect switch did open subsequent to an instruction or command to do so, (b) identification of possible user fraud, as would possibly be reflected by the presence of voltage at a time when the remote disconnect switch is open, (c) verification that the remote disconnect switch did re-close after having been given an instruction or command to close, and (d) verification of lack of voltage present before re-closing such remote disconnect switch, which serves an important safety feature.

22 Claims, 4 Drawing Sheets

U.S. PATENT DOCUMENTS

| | | | |
|---|---|---|---|
| 5,311,541 A | 5/1994 | Sanderford, Jr. | |
| 5,377,222 A | 12/1994 | Sanderford, Jr. | |
| 5,377,232 A | 12/1994 | Davidov et al. | |
| 5,391,983 A * | 2/1995 | Lusignan et al. | 324/142 |
| 5,422,565 A | 6/1995 | Swanson | |
| 5,457,713 A | 10/1995 | Sanderford, Jr. et al. | |
| 5,486,805 A | 1/1996 | Mak | |
| 5,598,427 A | 1/1997 | Arthur et al. | |
| 5,604,768 A | 2/1997 | Fulton | |
| 5,626,755 A | 5/1997 | Keyser et al. | |
| 5,631,554 A * | 5/1997 | Briese et al. | 324/76.77 |
| 5,661,750 A | 8/1997 | Fulton | |
| 5,668,828 A | 9/1997 | Sanderford, Jr. et al. | |
| 5,696,441 A | 12/1997 | Mak et al. | |
| RE35,829 E | 6/1998 | Sanderford, Jr. | |
| 5,920,589 A | 7/1999 | Rouquette et al. | |
| 5,926,531 A | 7/1999 | Petite | |
| 5,933,072 A | 8/1999 | Kelley | |
| 5,940,009 A * | 8/1999 | Loy et al. | 340/870.02 |
| 5,953,368 A | 9/1999 | Sanderford et al. | |
| 5,987,058 A | 11/1999 | Sanderford et al. | |
| 6,028,522 A | 2/2000 | Petite | |
| 6,031,883 A | 2/2000 | Sanderford, Jr. et al. | |
| 6,043,642 A * | 3/2000 | Martin et al. | 324/142 |
| 6,044,062 A | 3/2000 | Brownrigg et al. | |
| 6,047,016 A | 4/2000 | Ramberg et al. | |
| 6,094,622 A * | 7/2000 | Hubbard et al. | 702/61 |
| 6,100,816 A | 8/2000 | Moore | |
| 6,163,276 A | 12/2000 | Irving et al. | |
| 6,178,197 B1 | 1/2001 | Froelich et al. | |
| 6,181,258 B1 | 1/2001 | Summers et al. | |
| 6,195,018 B1 | 2/2001 | Ragle et al. | |
| 6,218,953 B1 | 4/2001 | Petite | |
| 6,232,885 B1 | 5/2001 | Ridenour et al. | |
| 6,233,327 B1 | 5/2001 | Petite | |
| 6,236,197 B1 * | 5/2001 | Holdsclaw et al. | 324/110 |
| 6,246,677 B1 | 6/2001 | Nap et al. | |
| 6,249,516 B1 | 6/2001 | Brownrigg et al. | |
| 6,263,009 B1 | 7/2001 | Ramberg et al. | |
| 6,335,953 B1 | 1/2002 | Sanderford, Jr. et al. | |
| 6,363,057 B1 | 3/2002 | Ardalan et al. | |
| 6,369,769 B1 | 4/2002 | Nap et al. | |
| 6,377,609 B1 | 4/2002 | Brennan, Jr. | |
| 6,396,839 B1 | 5/2002 | Ardalan et al. | |
| 6,424,270 B1 | 7/2002 | Ali | |
| 6,426,027 B1 | 7/2002 | Scarborough, III et al. | |
| 6,430,268 B1 | 8/2002 | Petite | |
| 6,437,692 B1 | 8/2002 | Petite et al. | |
| 6,452,986 B1 | 9/2002 | Luxford et al. | |
| 6,456,644 B1 | 9/2002 | Ramberg et al. | |
| 6,538,577 B1 | 3/2003 | Ehrke et al. | |
| 6,604,434 B1 | 8/2003 | Hamilton et al. | |
| 6,612,188 B2 | 9/2003 | Hamilton | |
| 6,617,879 B1 | 9/2003 | Chung | |
| 6,617,976 B2 | 9/2003 | Walden et al. | |
| 6,617,978 B2 | 9/2003 | Ridenour et al. | |
| 6,618,578 B1 | 9/2003 | Petite | |
| 6,626,048 B1 | 9/2003 | Dam Es et al. | |
| 6,628,764 B1 | 9/2003 | Petite | |
| 6,639,939 B1 | 10/2003 | Naden et al. | |
| 6,650,249 B2 | 11/2003 | Meyer et al. | |
| 6,657,552 B2 | 12/2003 | Belski et al. | |
| 6,671,586 B2 | 12/2003 | David et al. | |
| 6,700,902 B1 | 3/2004 | Meyer | |
| 6,704,301 B2 | 3/2004 | Chari et al. | |
| 6,734,663 B2 | 5/2004 | Fye et al. | |
| 6,747,557 B1 | 6/2004 | Petite et al. | |
| 6,747,981 B2 | 6/2004 | Ardalan et al. | |
| 6,778,099 B1 | 8/2004 | Meyer et al. | |
| 6,784,807 B2 | 8/2004 | Petite et al. | |
| 6,792,337 B2 * | 9/2004 | Blackett et al. | 700/295 |
| 6,816,538 B2 | 11/2004 | Shuey et al. | |
| 6,836,108 B1 | 12/2004 | Balko et al. | |
| 6,836,737 B2 | 12/2004 | Petite et al. | |
| 6,850,197 B2 | 2/2005 | Paun | |
| 6,859,186 B2 | 2/2005 | Lizalek et al. | |
| 6,862,498 B2 | 3/2005 | David et al. | |
| 6,867,707 B1 | 3/2005 | Kelley et al. | |
| 6,885,309 B1 | 4/2005 | Van Heteren | |
| 6,891,838 B1 | 5/2005 | Petite et al. | |
| 6,900,737 B1 | 5/2005 | Ardalan et al. | |
| 6,914,533 B2 | 7/2005 | Petite | |
| 6,914,893 B2 | 7/2005 | Petite | |
| 6,918,311 B2 | 7/2005 | Nathan | |
| 6,931,445 B2 | 8/2005 | Davis | |
| 6,940,396 B2 | 9/2005 | Hammond et al. | |
| 6,965,575 B2 | 11/2005 | Srikrishna et al. | |
| 6,972,555 B2 | 12/2005 | Balko et al. | |
| 6,982,651 B2 | 1/2006 | Fischer | |
| 7,023,680 B1 * | 4/2006 | Johnson et al. | 361/111 |
| 7,046,682 B2 | 5/2006 | Carpenter et al. | |
| 7,054,271 B2 | 5/2006 | Brownrigg et al. | |
| 7,091,878 B2 | 8/2006 | Holle et al. | |
| 7,103,511 B2 | 9/2006 | Petite | |
| 7,126,494 B2 | 10/2006 | Ardalan et al. | |
| 7,298,135 B2 * | 11/2007 | Briese et al. | 324/142 |
| 2002/0019725 A1 | 2/2002 | Petite | |
| 2002/0146985 A1 | 10/2002 | Naden | |
| 2002/0169643 A1 | 11/2002 | Petite et al. | |
| 2003/0048199 A1 | 3/2003 | Zigdon et al. | |
| 2003/0063723 A1 | 4/2003 | Booth et al. | |
| 2003/0078029 A1 | 4/2003 | Petite | |
| 2003/0093484 A1 | 5/2003 | Petite | |
| 2003/0103486 A1 | 6/2003 | Salt et al. | |
| 2003/0179149 A1 | 9/2003 | Savage et al. | |
| 2004/0004555 A1 | 1/2004 | Martin | |
| 2004/0008663 A1 | 1/2004 | Srikrishna et al. | |
| 2004/0040368 A1 | 3/2004 | Guckenberger et al. | |
| 2004/0053639 A1 | 3/2004 | Petite et al. | |
| 2004/0061623 A1 | 4/2004 | Tootoonian Mashhad et al. | |
| 2004/0062224 A1 | 4/2004 | Brownrigg et al. | |
| 2004/0085928 A1 | 5/2004 | Chari et al. | |
| 2004/0088083 A1 | 5/2004 | Davis et al. | |
| 2004/0131125 A1 | 7/2004 | Sanderford, Jr. et al. | |
| 2004/0183687 A1 | 9/2004 | Petite et al. | |
| 2004/0192415 A1 | 9/2004 | Luglio et al. | |
| 2004/0218616 A1 | 11/2004 | Ardalan et al. | |
| 2004/0264379 A1 | 12/2004 | Srikrishna et al. | |
| 2004/0264435 A1 | 12/2004 | Chari et al. | |
| 2005/0024235 A1 | 2/2005 | Shuey et al. | |
| 2005/0030199 A1 | 2/2005 | Petite et al. | |
| 2005/0036487 A1 | 2/2005 | Srikrishna | |
| 2005/0043059 A1 | 2/2005 | Petite et al. | |
| 2005/0043860 A1 | 2/2005 | Petite | |
| 2005/0052290 A1 | 3/2005 | Naden et al. | |
| 2005/0052328 A1 | 3/2005 | De Angelis | |
| 2005/0068970 A1 | 3/2005 | Srikrishna et al. | |
| 2005/0074015 A1 | 4/2005 | Chari et al. | |
| 2005/0129005 A1 | 6/2005 | Srikrishna et al. | |
| 2005/0147097 A1 | 7/2005 | Chari et al. | |
| 2005/0163144 A1 | 7/2005 | Srikrishna et al. | |
| 2005/0169020 A1 | 8/2005 | Knill | |
| 2005/0171696 A1 | 8/2005 | Naden et al. | |
| 2005/0172024 A1 | 8/2005 | Cheifot et al. | |
| 2005/0190055 A1 | 9/2005 | Petite | |
| 2005/0195768 A1 | 9/2005 | Petite et al. | |
| 2005/0195775 A1 | 9/2005 | Petite et al. | |
| 2005/0201397 A1 | 9/2005 | Petite | |
| 2005/0218873 A1 | 10/2005 | Shuey et al. | |
| 2005/0226179 A1 | 10/2005 | Behroozi | |
| 2005/0243867 A1 | 11/2005 | Petite | |
| 2005/0251401 A1 | 11/2005 | Shuey | |
| 2005/0251403 A1 | 11/2005 | Shuey | |
| 2005/0271006 A1 | 12/2005 | Chari et al. | |
| 2005/0278440 A1 | 12/2005 | Scoggins | |
| 2006/0002350 A1 | 1/2006 | Behroozi | |
| 2006/0012935 A1 | 1/2006 | Murphy | |
| 2006/0018303 A1 | 1/2006 | Sugiarto et al. | |
| 2006/0038548 A1 | 2/2006 | Shuey | |
| 2006/0043961 A1 | 3/2006 | Loy | |
| 2006/0071810 A1 | 4/2006 | Scoggins et al. | |
| 2006/0071812 A1 | 4/2006 | Mason, Jr. et al. | |
| 2006/0091877 A1 * | 5/2006 | Robinson et al. | 324/76.11 |
| 2008/0088296 A1 * | 4/2008 | Makinson et al. | 324/110 |

* cited by examiner

LOAD SIDE VOLTAGE SENSING FOR AMI METROLOGY

PRIORITY CLAIM

This application claims the benefit of previously filed U.S. Provisional Patent Application entitled "LOAD SIDE VOLTAGE SENSING FOR AMI METROLOGY," assigned U.S. Ser. No. 60/845,057, filed Sep. 15, 2006, and which is hereby incorporated herein by reference in its entirety for all purposes.

FIELD OF THE INVENTION

The present technology relates to utility meters. More particularly, the present technology relates to methodologies and apparatus for providing load side voltage sensing for utility meters which preferably are operable with remote disconnect features in an Advanced Metering Infrastructure (AMI) open operational framework.

BACKGROUND OF THE INVENTION

The general object of metrology is to monitor one or more selected physical phenomena to permit a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers have been historically used for outputting accumulated electricity consumption data. Such an approach provided a relatively dependable field device, especially for the basic or relatively lower level task of simply monitoring accumulated kilowatt-hour consumption.

The foregoing basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it became desirable to obtain usage data beyond the basic kilowatt-hour consumption readings available with many electricity meters. For example, additional desired data included rate of electricity consumption, or date and time of consumption (so-called "time of use" data). Solid state devices provided on printed circuit boards, for example, utilizing programmable integrated circuit components, have provided effective tools for implementing many of such higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems or cellular linkups.

The advent of such variety and alternatives has often required utility companies to make choices about which technologies to utilize. Such choices have from time to time been made based on philosophical points and preferences and/or based on practical points such as, training and familiarity of field personnel with specific designs.

Another aspect of the progression of technology in such area of metrology is that various retrofit arrangements have been instituted. For example, some attempts have been made to provide basic metering devices with selected more advanced features without having to completely change or replace the basic meter in the field. For example, attempts have been made to outfit a basically mechanical metering device with electronic output of data, such as for facilitating radio telemetry linkages.

Another aspect of the electricity meter industry is that utility companies have large-scale requirements, sometimes involving literally hundreds of thousands of individual meter installations, or data points. Implementing incremental changes in technology, such as retrofitting new features into existing equipment, or attempting to implement changes to basic components which make various components not interchangeable with other configurations already in the field, can generate considerable industry problems.

Electricity meters typically include input circuitry for receiving voltage and current signals at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry.

Electricity meter input circuitry may be provided with capabilities of monitoring one or more phases, depending on whether monitoring is to be provided in a single or multiphase environment. Moreover, it is desirable that selectively configurable circuitry may be provided so as to enable the provision of new, alternative or upgraded services or processing capabilities within an existing metering device. Such variations in desired monitoring environments or capabilities, however, lead to the requirement that a number of different metrology configurations be devised to accommodate the number of phases required or desired to be monitored or to provide alternative, additional or upgraded processing capability within a utility meter.

More recently a new ANSI protocol, ANSI C12.22, is being developed that may be used to permit open protocol communications among metrology devices from various manufacturers. C12.22 is the designation of the latest subclass of the ANSI C12.xx family of Meter Communication and Data standards. These standards currently include ANSI C12.18 relating to protocol specifications for Type 2 optical ports; ANSI C12.19 relating to Utility industry Meter Data Table definitions; and ANSI C12.21 relating to Plain Old Telephone Service (POTS) transport of C12.19 Data Tables definition.

C12.22 is an application layer protocol that provides for the transport of C12.19 data tables over any network medium. Current standards for the C12.22 protocol include: authentication and encryption features; addressing methodology providing unique identifiers for corporate, communication, and end device entities; self describing data models; and message routing over heterogeneous networks.

Much as HTTP protocol provides for a common application layer for web browsers, C12.22 provides for a common application layer for metering devices. Benefits of using such a standard include the provision of: a methodology for both session and session-less communications; common data encryption and security; a common addressing mechanism for use over both proprietary and non-proprietary network mediums; interoperability among metering devices within a common communication environment; system integration with third-party devices through common interfaces and gateway abstraction; both 2-way and 1-way communications with end devices; and enhanced security, reliability and speed for transferring meter data over heterogeneous networks.

To understand why utilities are keenly interested in open protocol communications; consider the process and ease of sending e-mails from a laptop computer or a smart phone. Internet providers depend on the use of open protocols to provide e-mail service. E-mails are sent and received as long as e-mail addresses are valid, mailboxes are not full, and communication paths are functional. Most e-mail users have the option of choosing among several Internet providers and several technologies, from dial-up to cellular to broadband, depending mostly on the cost, speed, and mobility. The e-mail addresses are in a common format, and the protocols call for the e-mail to be carried by communication carriers without changing the e-mail. The open protocol laid out in the ANSI C.12.22 standard provides the same opportunity for meter communications over networks.

One function previously known has been to integrally incorporate a whole service disconnection device with a meter. Such a feature or function, known also as "remote disconnect," allows the entire electrical service to be switched off at a location where the remote disconnect switch (or meter with integral remote disconnect function) is installed.

In general, it may be possible to variously communicate instructions to such remote disconnect switch (whether such comprises an independent device or one integrally provided in conjunction with a meter). For example, there are so-called 2-way communications linkages which could offer such communication ability. The above-referenced Advanced Metering Infrastructure (AMI) environment would also generally provide such communication ability, though it is to be understood that 2-way communications are not the same as an AMI environment, per se.

In general, 2-way communications involve technology that supports bi-directional communications, and may involve an endpoint device such as a meter. Typical attributes in such circumstances are that there is generally high data collection reliability, the ability to obtain register reads generally on demand, and the ability to perform a demand reset, as well as the above-mentioned remote disconnect (and re-connect) functionality. AMI can generally provide such attributes as typically associated with a communications link as well as provide what may be thought of (in a metering context) as integral demand response, such as load control and verification, critical Peak Pricing management, consumer access, 3rd party devices certified on network, and other Advanced Metering functionality (now or later developed). So, generally speaking, AMI typically involves 2-way communications but not all 2-way communications involve or support AMI functionality.

In addition, the desire for increased processing capabilities as well as other considerations including, but not limited to, a desire to provide enhanced capabilities resulting in improved functionality, increased safety, and greater economy vis-à-vis fraud detection for individual metrology components in an open operational framework, leads to requirements for interfacing such components with system applications.

As such, it is desired to provide an improved interface for coupling utility meters to their respective load side environment, as well as their system applications in an open operational framework.

While various aspects and alternative embodiments may be known in the field of utility metering, no one design has emerged that generally encompasses the above-referenced characteristics and other desirable features associated with utility metering technology as herein presented.

SUMMARY OF THE INVENTION

In view of the recognized features encountered in the prior art and addressed by the present subject matter, improved apparatus and methodologies of metrology devices in an open operational framework vis-à-vis their load side environment have been provided.

In exemplary arrangements, methodologies and apparatus have been provided to permit transmission of operational data and information between a utility meter and an operational application through a network.

In one of its simpler forms, the present technology provides methodologies and apparatus for interface between operational data and control via a network and meters operatively associated with such network.

One positive aspect of such interface is that it functions to provide enhanced capabilities resulting in improved functionality based on load side environment data at each respective meter operatively associated with such network.

Another positive aspect of such interface is that it functions to provide enhanced and/or increased safety capabilities resulting in improved functionality based on load side environment data at each respective meter operatively associated with such network.

Yet another positive aspect of such interface is that it functions to provide greater economy vis-à-vis enhanced and/or increased fraud detection capabilities resulting in improved functionality based on load side environment data at each respective meter operatively associated with such network.

Yet still a further positive aspect of such interface is that a methodology has been developed for integrating voltage detection terminals into the line side bus work.

In further present exemplary aspects, there is the provision preferably of a detection circuit, situated downstream of a remote disconnect switching functionality, and by which so-called "load side" voltage may be sense. In such fashion, the present technology advantageously permits verification that the disconnect function was operative after an appropriate instruction, and alternately that a re-connect functionality was operative after an appropriate instruction.

In still additional exemplary aspects, the utilization of such detection functionality (in conjunction with other present subject matter), would permit the detection of possible fraud, based on the presence of a load-side voltage after a disconnect switching functionality had been operative. Because the economic losses of any fraud eventually are borne by all legitimate consumers, the present subject matter advantageously contributes to greater economy of operation to the extent that it can help deter and/or detect such fraud.

Yet further exemplary aspects of the present technology may relate to enhanced and/or increased safety capabilities. More specifically, verification of lack of a voltage before a switch is closed and service is re-connected could help prevent an equipment-damaging out-of-phase condition (regardless of whether the voltage is there improperly or legitimately, for example, legally shared from a neighbor's house). Again, any safety issue which is a threat to equipment can ultimately become a threat to the safety of persons, so the present subject matter advantageously contributes to greater safety of operation to the extent that it can help detect or prevent such potentially unsafe operating conditions.

One present exemplary embodiment relates to an electricity meter for use within an advanced metering system having and operating relative to a network, other meters, user interfaces, and central collection functionality. Such an exemplary meter preferably comprises a line side which receives electrical service when connected to such meter; a load side, downstream from the meter line side, which electrically connects with an electrical load when connected to such meter; a detection circuit, upstream from the meter load side and downstream from the meter line side, for detecting the presence of electricity at the meter load side; a remote disconnect switch, upstream from the detection circuit and downstream from the meter line side, controllably actuated for electrically connecting and disconnecting the meter line side relative to the meter load side, so that electrical service when present at the meter line side is, respectively, electrically connected with, and disconnected from, an electrical load when present at the meter load side; metrology, downstream from the meter line side and upstream from the meter load side, for monitoring the consumption or production of electricity vis-à-vis electrical service and electrical load associated with such meter; and a bidirectional communications link, linking such meter and a network operating relative to an advanced metering system. With such an exemplary arrangement, data may be communicated regarding actuation of the remote disconnect switch and presence of electricity at the meter load side.

In various alternative embodiments of the foregoing present exemplary subject matter, such detection circuit may comprise a voltage sensor electrically in parallel with the meter load side, while the metrology may include current acquisition circuitry for receiving electrical service current signals, and voltage acquisition circuitry for receiving electrical service voltage signals.

In yet other present alternative arrangements, the bidirectional communications link may preferably include at least one communications module configured to effect bi-directional communications between the meter and other networked devices using an open standard meter communication protocol. In some of such alternatives, the at least one communications module may include one of an additional circuit board dedicated to WAN connectivity and one or more of GPRS, Ethernet, and RF LAN communications modules.

Other present exemplary embodiments are more related to an advanced metering system with added functionality based on meter load side sensing. One such exemplary present system may comprise a plurality of end devices, and a network including central collection functionality, and configured for bi-directional communications between the central collection functionality and each of such plurality of end devices.

In such foregoing exemplary system arrangement, at least some of such end devices may comprise electricity meters, each of such electricity meters having a line side for receiving electrical service; a load side, downstream from the meter line side, for electrically connecting with an electrical load; a detection circuit, upstream from the meter load side and downstream from the meter line side, for detecting the presence of electricity at the meter load side; a remote disconnect switch, upstream from the detection circuit and downstream from the meter line side, for controllably actuating for electrically connecting and disconnecting the meter line side relative to the meter load side, so that electrical service when present at the meter line side is, respectively, electrically connected with, and disconnected from, an electrical load when present at the meter load side; and metrology, downstream from the meter line side and upstream from the meter load side, for monitoring the consumption or production of electricity vis-à-vis electrical service and electrical load associated with the meter. Further in such exemplary alternatives, with inclusion of such a network and related central collection functionality, data may be communicated across the network regarding actuation of the remote disconnect switch of an electricity meter and presence of electricity at the meter load side thereof.

In some other present exemplary alternatives of the foregoing arrangements, selected of the plurality of end devices may alternatively be configured to relay bi-directional communications between the central collection functionality and others of the plurality of end devices; while the network may further include at least one cell relay, with the bi-directional communication between the central collection functionality and selected of such plurality of end devices passing through the at least one cell relay. In such exemplary alternatives, bi-directional communication between the central collection functionality and selected of such plurality of end devices is conducted by way of the cell relay while bi-directional communication between the central collection functionality and others of the plurality of end devices is conducted directly.

In other of the foregoing alternatives, such network may be configured for bi-directional communications so as to include using an open standard meter communication protocol.

It is still to be understood by those of ordinary skill in the art that the present subject matter may equally relate to various methodologies, one present example of which relates to a methodology for improved functionality of an electricity meter used within an advanced metering system having and operating relative to a network, other meters, user interfaces, and central collection functionality. Such present exemplary preferably may comprise providing an electricity meter having a line side for receiving electrical service; a load side, downstream from the meter line side, for electrically connecting with an electrical load; a detection circuit, upstream from the meter load side and downstream from the meter line side, for detecting the presence of electricity at the meter load side; a remote disconnect switch, upstream from the detection circuit and downstream from the meter line side, for controllably actuating for electrically connecting and disconnecting the meter line side relative to the meter load side, so that electrical service when present at the meter line side is, respectively, electrically connected with, and disconnected from, an electrical load when present at the meter load side; metrology, downstream from the meter line side and upstream from the meter load side, for monitoring the consumption or production of electricity vis-à-vis electrical service and electrical load associated with the meter; and a bidirectional communications link, linking the meter and a network operating relative to an advanced metering system. Such present exemplary may further include connecting electrical service to the meter line side; and connecting an electrical load to the meter load side, such that data may be communicated across the network regarding actuation of the remote disconnect switch and presence of electricity at the meter load side.

In present exemplary variations of such present methodology, a given method may further comprise actuating the remote disconnect switch so as to electrically disconnect the meter line side relative to the meter load side; and subsequently verifying that the remote disconnect switch electrically disconnected the meter line side relative to the meter load side. Other present variations may further comprise subsequent to verifying that the remote disconnect switch electrically disconnected the meter line side relative to the meter load side, actuating the remote disconnect switch so as to electrically re-connect the meter line side relative to the meter load side.

Still other present alternative methodologies may further comprise actuating the remote disconnect switch so as to electrically connect the meter line side relative to the meter load side; and subsequently verifying that the remote disconnect switch electrically connected the meter line side relative to the meter load side. As presently discussed hereinbelow, still further variations of the foregoing methodology may be practiced.

Still further, other present exemplary methodology embodiments may more relate to methodology for an advanced metering system with added functionality based on meter load side sensing. One exemplary such methodology may comprise providing a plurality of end devices, at least some of which end devices comprise electricity meters, each of such electricity meters having a line side for receiving electrical service; a load side, downstream from the meter line side, for electrically connecting with an electrical load; a detection circuit, upstream from the meter load side and downstream from the meter line side, for detecting the presence of electricity at the meter load side; a remote disconnect switch, upstream from the detection circuit and downstream from the meter line side, for controllably actuating for electrically connecting and disconnecting the meter line side relative to the meter load side, so that electrical service when present at the meter line side is, respectively, electrically connected with, and disconnected from, an electrical load when present at the meter load side; and metrology, downstream from the meter line side and upstream from the meter load side, for monitoring the consumption or production of electricity vis-à-vis electrical service and electrical load associated with the meter; providing a network including central collection functionality; configuring the network for bi-directional communications between the central collection functionality and each of the plurality of end devices; connecting electrical service to the meter line side of at least one of such electricity meters; and connecting an electrical load to the meter load side of such at least one electricity meter, such that data may be communicated across the network regarding actuation of the remote disconnect switch thereof and presence of electricity at the meter load side thereof.

In various present alternatives of the foregoing methodology for an advanced metering system, each detection circuit of an electricity meter comprises a voltage sensor electrically in parallel with the meter load side, such detection circuit including a filtering capacitor, an over-current protection resistor, an opto-isolator, and a transient voltage suppressor for setting the turn-on voltage of the voltage sensor; the metrology of each electricity meter includes current acquisition circuitry for receiving electrical service current signals, and voltage acquisition circuitry for receiving electrical service voltage signals, with such current acquisition circuitry and voltage acquisition circuitry configured for receiving multi-phase electrical service current and voltage signals, respectively, and such metrology is configured for correction of any monitoring offset relative to electrical service caused by the presence of the detection circuit in such electricity meter; and each electricity meter includes at least one communications module configured to effect bi-directional communications between the meter and other networked devices using an open standard meter communication protocol, with such at least one communications module including an additional circuit board dedicated to WAN connectivity, or one or more of GPRS, Ethernet, and RF LAN communications modules.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents including combinations of features, parts, or steps or configurations thereof not expressly shown in the figures or stated in the detailed description of such figures. Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
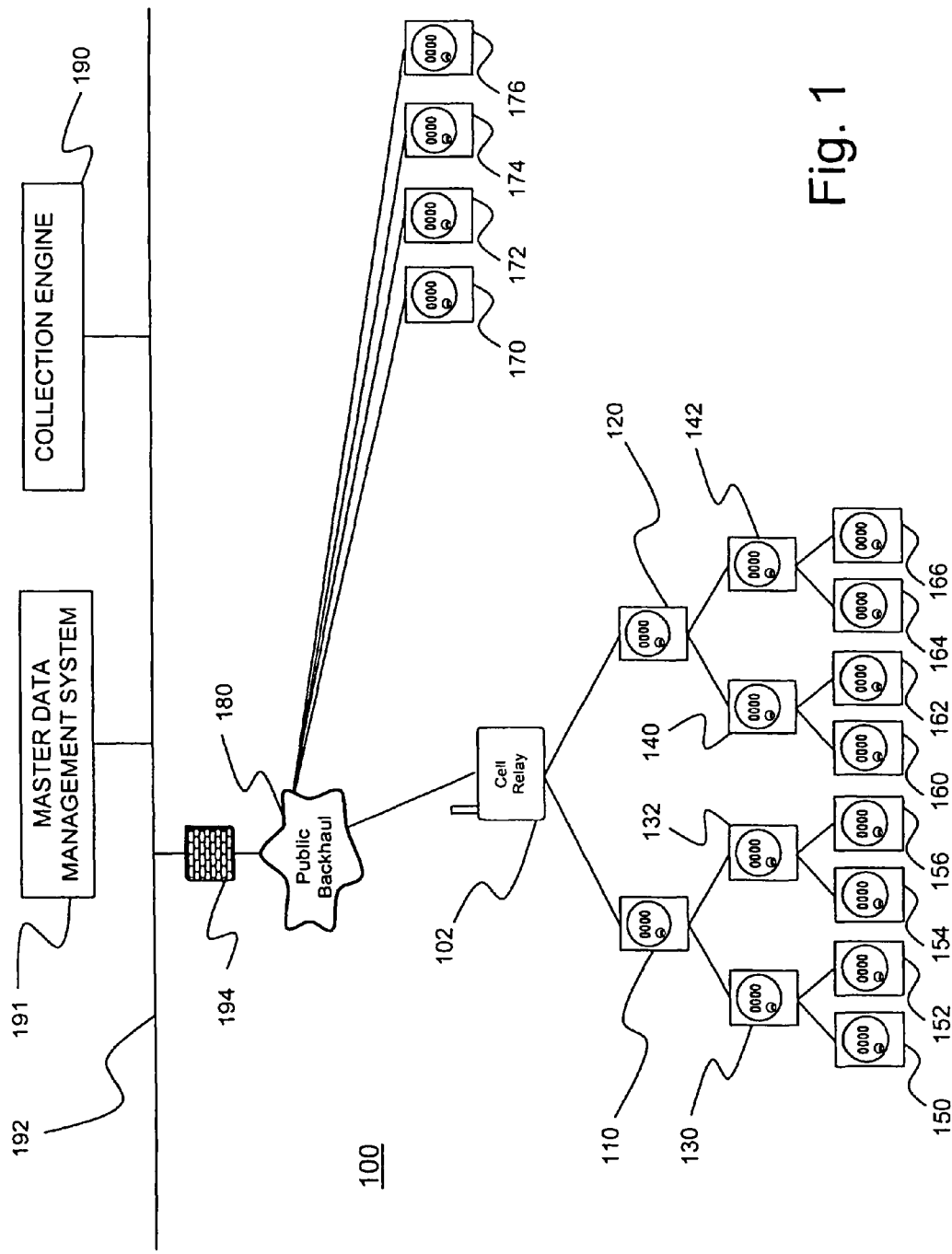
FIG. 1 is a block diagram overview illustration of an exemplary Advanced Metering System (AMS) or Infrastructure (AMI) deployment incorporating various of both apparatus and methodology aspects of the present subject matter.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with the provision of improved corresponding apparatus and methodologies allowing enhanced functionality of metrology devices in an open operational framework. More particularly, the present technology relates to methodologies and apparatus for providing load side voltage sensing for utility meters which preferably are operable with remote disconnect features in an Advanced Metering Infrastructure (AMI) open operational framework.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to presently preferred embodiments of the subject methodologies and apparatus. Referring to the drawings, FIG. 1 is a block diagram overview illustration of an exemplary Advanced Metering System (AMS) or Infrastructure (AMI) deployment 100 generally in accordance with the present subject matter incorporating various of both apparatus and methodology aspects of the present subject matter.

Advanced Metering System (AMS) 100 in pertinent part is preferably designed and built around industry standard protocols and transports, and therefore is intended to work with standards compliant components from third parties. In other words, AMS 100 is configured to be transparent in a transportation context, such that the exemplary respective meters may be interrogated (such as using representative Collection Engine generally 190) regardless of what network infrastructure exists in between or among such components. Moreover, due to such transparency, the respective meters preferably may also respond to Collection Engine 190 in the same manner. Preferably, as intended to be represented by the illustration in FIG. 1, Collection Engine 190 is capable of integrating Radio, PLC (Power Line Communications), and IP (Internet Protocol) connected meters, details of which communications form no particular aspects of the present subject matter.

In general, it is preferred that the system represented in present FIG. 1 provides full two-way messaging to every device. For example, the respectively represented meter devices may be variously configured to provide differing communications capabilities. In exemplary configurations, one or more of GPRS, Ethernet, and RF LAN communications modules may be provided. GPRS will allow meters to be IP addressable over a public backhaul and provide more bandwidth than the meter will likely ever require, but may incur ongoing subscription costs. Ethernet connectivity can be used to bridge to third party technologies, including WiFi, WiMax, in-home gateways, and BPL (Broadband over Power Lines), without integrating any of these technologies directly into the metering device, but with the tradeoff of requiring external wiring and a two part solution. Ethernet devices may be used primarily in pilots and other special applications, and they additionally may be ideal for certain high-density RF-intolerant environments, such as meter closets. Due to the increased complexity of managing certain interfaces, for example, such as a WAN interface, with its more sophisticated link negotiation requirements and TCP/IP (Transmission Control Protocol/Internet Protocol) stack, WAN connected meters may include an additional circuit board dedicated to WAN connectivity. All such alternative and exemplary supporting boards, if required, are considered to be part of preferred embodiments that sense and communicate control and information data in accordance with the present subject matter, whether using ANSI standard C12.22 communications protocol or otherwise.

Also, as discussed in greater detail herein, it is to be understood that the representative exemplary meter devices of present FIG. 1 are intended to represent meter devices associated respectively with remote disconnect (and re-connect) functionality, as well as other present features relative to load side voltage sensing and related features.

Communication with the Collection Engine 190 is preferably performed over an Internet Protocol connection, represented by such connection 192. The Wide-Area-Network is a fully routable, addressable, IP network that may involve a variety of different technologies including, but not limited to, GPRS, WiFi, WiMax, Fiber, Private Ethernet, BPL, or any other connection with sufficiently high bandwidth and ability to support full two-way IP communication. Several assumptions (that is, criteria of the present subject matter) may be made regarding the IP WAN. Collection Engine 190 is preferably implemented so as to be able to communicate directly with other respective nodes on the IP WAN. While communications may be conducted through a firewall 194, it is not necessary that such be proxied, unless the proxy is itself a C12.22 node functioning as a relay between a private IP network and the public IP WAN.

The Advanced Metering System as used in conjunction with the present technology provides a series (or plurality) of services (functionalities) to utilities. Beyond its most basic implementation (daily feeds of residential interval or TOU (Time of Use) data), it may provide power outage and restoration notifications, on-demand readings, firmware updates, load control/demand response, gas meter readings, and in-home display messages. All of such functions (services) may be preferably communicated via the ANSI standard C12.22 protocol.

With further reference to present reference to FIG. 1, it will be seen that an exemplary Advanced Metering System (AMS) generally 100 deployment has been illustrated for exemplary purposes only with a single RF LAN cell, with twelve respective exemplary member nodes organized into three levels, as well as four directly connected IP meters 170, 172, 174, and 176. In such exemplary arrangement of a system in conjunction with which the present subject matter may be practiced, all respective meter devices 110, 120, 130, 132, 140, 142, 150, 152, 154, 156, 160, 162, 164, 166, 170, 172, 174, and 176, Cell Relay 102, and Collection Engine 190, preferably have C12.22 network addresses, with Collection Engine 190 preferably having multiple C12.22 addresses to allow for separate addressing between different services (functionalities). Representative Meter Data Management System 191 is not part of any such C12.22 network, but preferably it will be implemented so as to communicate over the Utility LAN 192 to Collection Engine 190 via Web Services. Communications between Cell Relay 102 and Utility LAN 192 variously involve Public Backhaul 180 and firewall 194, in a manner as referenced above, as well understood by those of ordinary skill in the art.

The meter data acquisition process may be processed through operation of the Meter Data Management System 191, initiating a request for such data. Such requests may be sent out either directly to the device (in the case of an IP connected meter, such as 170), or to Cell Relay 102 that relays the message out to all appropriate nodes. While various tables per a manufacturer's stored procedure may be used, in response to C12.22 stored procedure calls, the various AMS enabled meters of FIG. 1 are preferably field programmable, via C12.22 tables, as to the type data to be included in any default upload. In any event, response processing can use the configured data about an end device and the response message from an end device to determine the results from such device. In the instance of the present subject matter, such operations allow responses that contain logs from the devices, such as relating to above-referenced load side sensed voltage data at a particular installation, all in accordance with the present subject matter.

Figure 2:
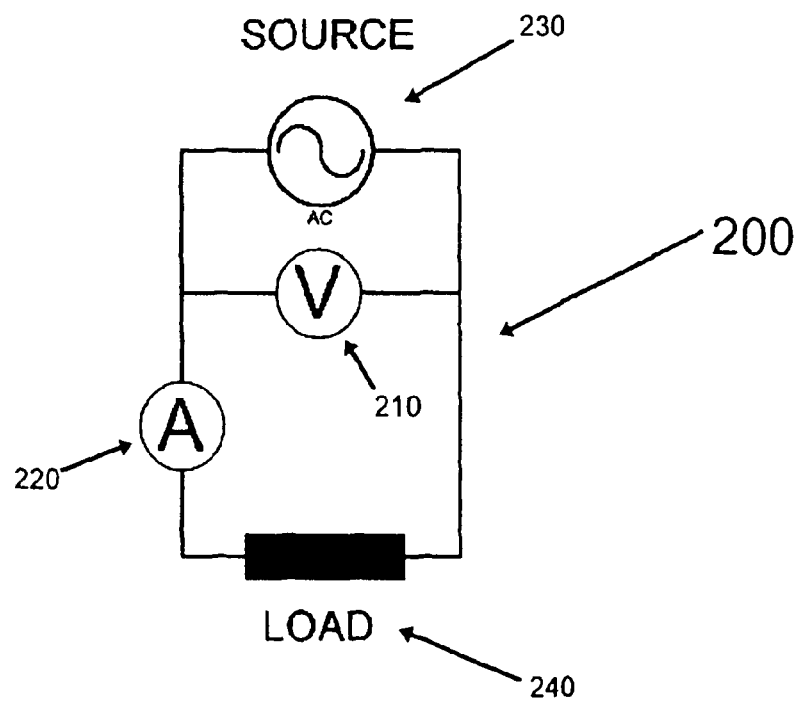
FIG. 2 illustrates for further background discussion purposes a block diagram of an exemplary watthour meter incorporating features in accordance with present ANSI watthour meter configuration standards.
Figure 3:
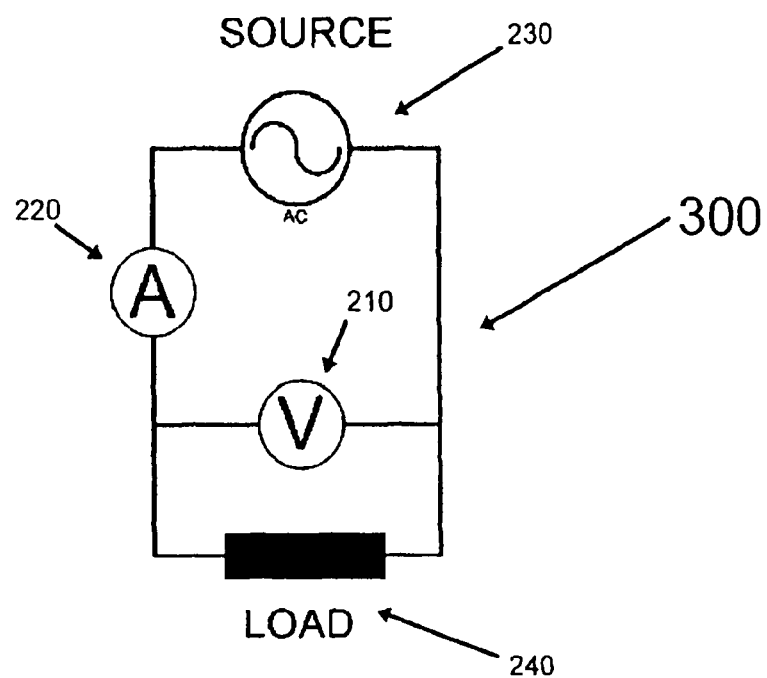
FIG. 3 illustrates for further background discussion purposes a block diagram of an exemplary watthour meter incorporating features in accordance with an alternative arrangement of an exemplary watthour meter configuration.

FIG. 2 illustrates for further background discussion purposes a block diagram of a representative exemplary watthour meter generally 200 incorporating features in accordance with present ANSI watthour meter configuration standards. FIG. 3 on the other hand illustrates for further background discussion purposes a block diagram of a representative exemplary watthour meter generally 300 incorporating features in accordance with an alternative arrangement of an exemplary watthour meter configuration.

The following includes a brief discussion relative to power consumption of a load side voltage detect circuit of an RDS (Remote Disconnect Switch) enabled meter per present subject matter, and the effects thereof on accuracy. As referenced in the above "Background" section as a general proposition, with all watt meters, there is essentially a voltage circuit and a current circuit. If each is separately calibrated, in general the watts determined with such arrangement will never be accurate if watts=V*A cos(theta). The reasoning behind such statement is because in the case of a watthour meter design that has the voltmeter portion thereof above (in a supply versus load context) the current meter portion thereof, some current is lost in the voltage circuit and thus such current is not measured by the ammeter. Conversely, in the case of a watthour meter design where the ammeter portion is above the voltmeter portion (again, in the supply versus load context), there will be some voltage drop in the ammeter which is not measured by the voltmeter. Therefore, from a design perspective, some "burden" from the voltmeter or the ammeter must be intentionally removed from the resulting watt reading.

As well known to those of ordinary skill in the art, all ANSI standard watthour meters are arranged in the manner of the watthour meter design generally 200 as diagrammatically represented in present FIG. 2. Such is the watthour meter design that has the voltmeter portion generally 210 thereof above the current meter portion generally 220 thereof (in a supply generally 230 versus load generally 240 context). Because the burden of the ammeter portion generally 220 is never removed, some current is lost in the voltage circuit generally 210 and thus such current is not measured by the ammeter generally 220. From an industry standard perspective, it is generally recognized and understood that (if unaccounted for) any current coil losses would be paid for by the end user. Such fact is equally true in the instance of practicing the present subject matter with reference to any additional resistance losses in the contacts and metal conductors, such as copper, associated with a remote disconnect switch functionality.

Conversely, in the watthour meter design generally 300 diagrammatically represented in present FIG. 3, the burden in the voltmeter portion generally 210 is not measured, and hence any resulting watt losses would be incurred by the utility supplying service to such meter 300.

Figure 4:
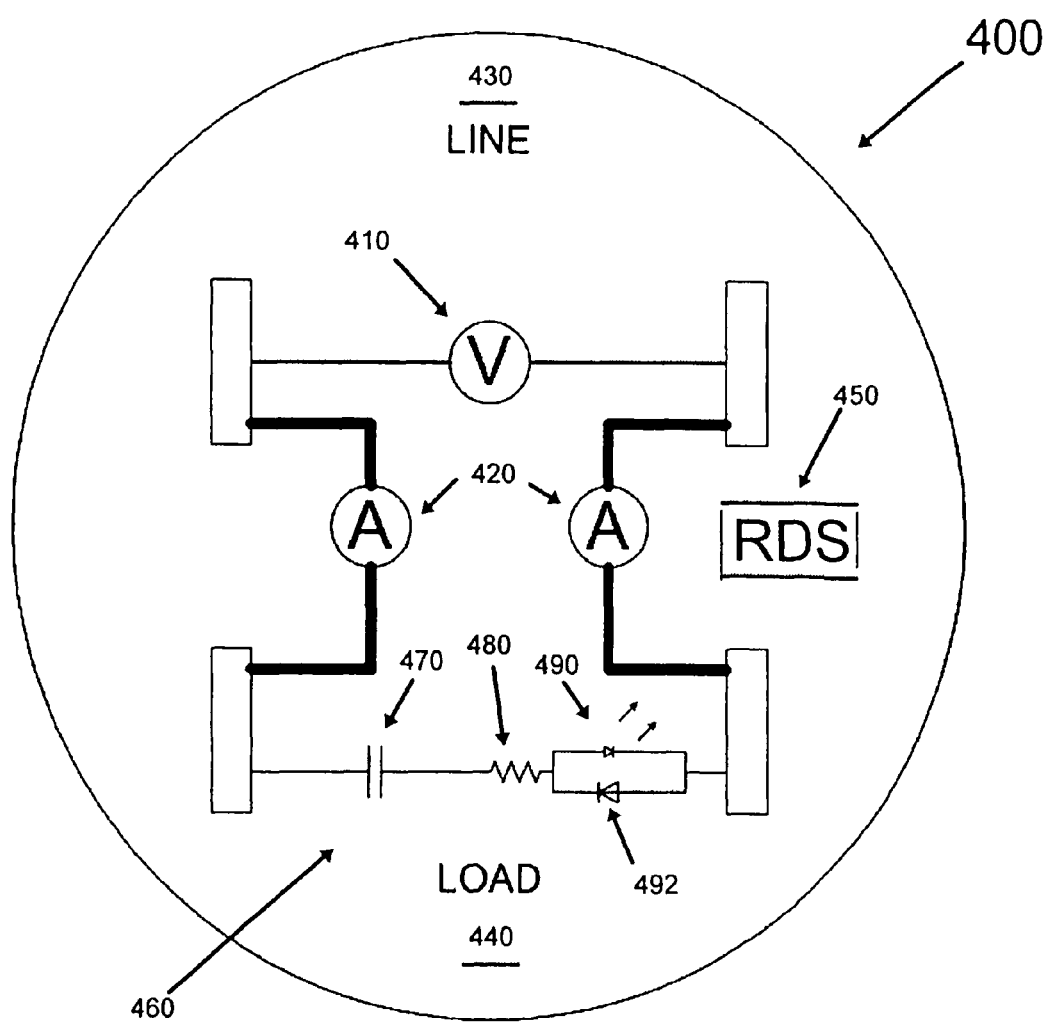
FIG. 4 illustrates for further disclosure purposes relating to present subject matter a block diagram of an exemplary watthour meter incorporating features in accordance with present ANSI watthour meter configuration standards, incorporating remote disconnect features, and further incorporating subject matter of the presently disclosed technology relative to load side voltage sensing and related present features.

FIG. 4 illustrates for further disclosure purposes relating to present subject matter a block diagram of an exemplary watthour meter generally 400 incorporating features in accordance with present ANSI watthour meter configuration standards, incorporating remote disconnect features generally 450, and further incorporating subject matter of the presently disclosed technology relative to load side voltage sensing and related present features. It is also to be understood by those of ordinary skill in the art that the description herewith of an exemplary meter 400 in accordance with present subject matter is likewise a description of the representative meters variously illustrated in present FIG. 1. It is also to be understood that in some implementations of the present subject matter, not all of the meters utilized in a particular arrangement must conform with all or a particular subset of the features presently described, as some meters in an arrangement may practice the present subject matter while some do not.

The following more particularly describes present subject matter, using for example, load side voltage data in conjunction with a meter having remotely disconnectable service features. In the context of present FIG. 4, it is to be understood that the terminology "downstream" means towards the load side generally 440 thereof versus the source or line side generally 430 thereof, which would be "upstream" of the load side 440. Because integration of a whole service disconnection device or feature is not unique to the present subject matter, and details thereof form no particular present aspects of the subject technology, an RDS (Remote Disconnect Switch) device is only generally represented by block diagram 450. As such, the present subject matter is intended to be usable in combination with all such types of devices and functionality and equivalents thereof, whether now or later existing.

In more particular, the present subject matter utilizes a detection circuit or means generally 460, which is situated generally downstream of the RDS 450. Such detection circuit or means 460 has a primary purpose and/or function of being able to sense whether voltage exists or doesn't exist at such relatively downstream, or load side location. Providing such functionality allows for the following, all in accordance with the present subject matter: (a) verification that the RDS 450 switch did open subsequent to an instruction or command to do so, (b) identification of possible user fraud, as would possibly be reflected by the presence of voltage at a time when RDS 450 is open, (c) verification that RDS 450 did re-close after having been given an instruction or command to close, and (d) verification of lack of voltage present before re-closing RDS 450, which serves an important safety feature. Such latter verification is important as a safety feature because if power is being supplied, legally or illegally to the load side generally 440 of RDS 450, then RDS 450 could close in an out-of-phase condition, which is often hazardous to any equipment involved. Hazards to equipment have a way of subsequently also becoming hazards to persons, whether for example, through resulting shock or fire conditions.

Other presently advantageous aspects of the present subject matter which will be understood by those of ordinary skill in the art is that the present exemplary arrangements provide a mechanism for using, for example, firmware-based correction of the metering offset caused by any burden of the detection circuit generally 460. Normally such burden would be billed to the customer, but the present technology advantageously permits such cost to be redirected so as to be born by the utility. Although such is a relatively very low energy usage, it is nonetheless measurable, and a meter fabricated in accordance with the present subject matter will provide a built in correction for such usage burden.

One possible implementation of the present subject matter is to compare the phase angle of the line side voltage generally 430 to the load side voltage 440 (which, of course, under normal disconnect conditions, should not exist). If such compared angle is changing, then the load side generally 440 is likely powered by a stand-alone generator, which would normally mean that there are no fraudulent practices involved. However, if the voltage angles remain synchronized (that is, they are not changing), then power is coming from a common source, which should mean the utility supplying the line or source side generally 430. However, there are at least two possible ways for such utility source to be involved. One would be from a customer's neighbor (which could be legally obtained or possibly illegally obtained). Another possibility would be from some sort of by-pass arrangement (which would be improper, illegal, or fraudulent). Therefore, synchronized voltage angles would typically merit further investigation by the utility to determine whether there were some improper activities involved.

An idealized (that is, simplified) version of a present exemplary voltage detection circuit 460 is shown in FIG. 4. Note that due to its position in the meter 400 as represented, it is seen as a parallel load, and is metered the same as any other load would be. The representative capacitor generally 470 is used to drop 60 Hz voltage. The representative resistor 480 generally is used to prevent over-current during surges. The representative LED generally 490 is part of an opto-isolator that prevents line generally 430 and load generally 440 from being tied together whenever RDS 450 is opened. There is also a TVS (Transient Voltage Suppressor) generally 492 that sets the turn-on threshold of the system or circuitry generally 460. A TVS is often basically a form of back to back zener diode, and it is where most of the watts loss occurs.

If the meter generally 400 is calibrated so-called closed link (well known to one of ordinary skill in the art), then the afore-mentioned load would be metered by the utility, but not by any standard instrument or equipment (if phantom loaded). Such fact is because the current flowing in the detection circuit generally 460 is supplied by the voltage source, the same as the potential sense circuit, and the power supply (the last 2 elements are not metered by the meter, however, as they are before the current circuits, as stated above). In such case, the described loss will be calibrated out of the meter at the test point, but will show as an offset, which will not be calibrated out.

On the other hand, if the meter is calibrated so-called open link (well known to one of ordinary skill in the art), then there will be no voltage across the detection circuit generally 460. Therefore, this is no corresponding current or load. It will not, therefore be sensed by either the meter generally 400 or any standard instrument or equipment. Such will be an offset in the load curve that is not normalized at such test point.

From the foregoing, one of ordinary skill in the art will note an implication of a differential error between open and closed link testing. Open link ignores the aforementioned loss, while closed link does not. Thought of another way, closed link will always show the meter "slower" (to use the language of the old mechanical meter pictured as having a rotating dial, the speed of which reflects the rate of consumption of the measured commodity, such as electricity).

In view of all the foregoing, including present industry practices with respect to burden shifting, one preferred manner of practicing the present subject matter would be to calibrate per the so-called closed link approach. In such circumstances, the following error data and corresponding calculations would be applicable:

Amount of error: This is 0.3 W.

240V, 30 A, we are looking at 7200 W for an error of 0.004% fast 240V, 2 A (ANSI lower limit), 480W or 0.06% fast 240V, 2 mA, we are looking at 4.8 watts or an error of 6.25% fast It should be appreciated that such results appropriately correlate with reasoned expectations, as there is more power delivered to the meter than a customer is actually consuming. All of the delivered power is metered; therefore, the meter resultantly shows "fast" (using the "rotation" connotations above with reference to metering terminology). Therefore, meters tested on closed link devices (for example, such as a so-called RFL produced now by Radian Research) will show results at the low end which are regarded as being fast, but will show results which are correct (if all other factors are equal) if tested on open link equipment.

Figure 5:
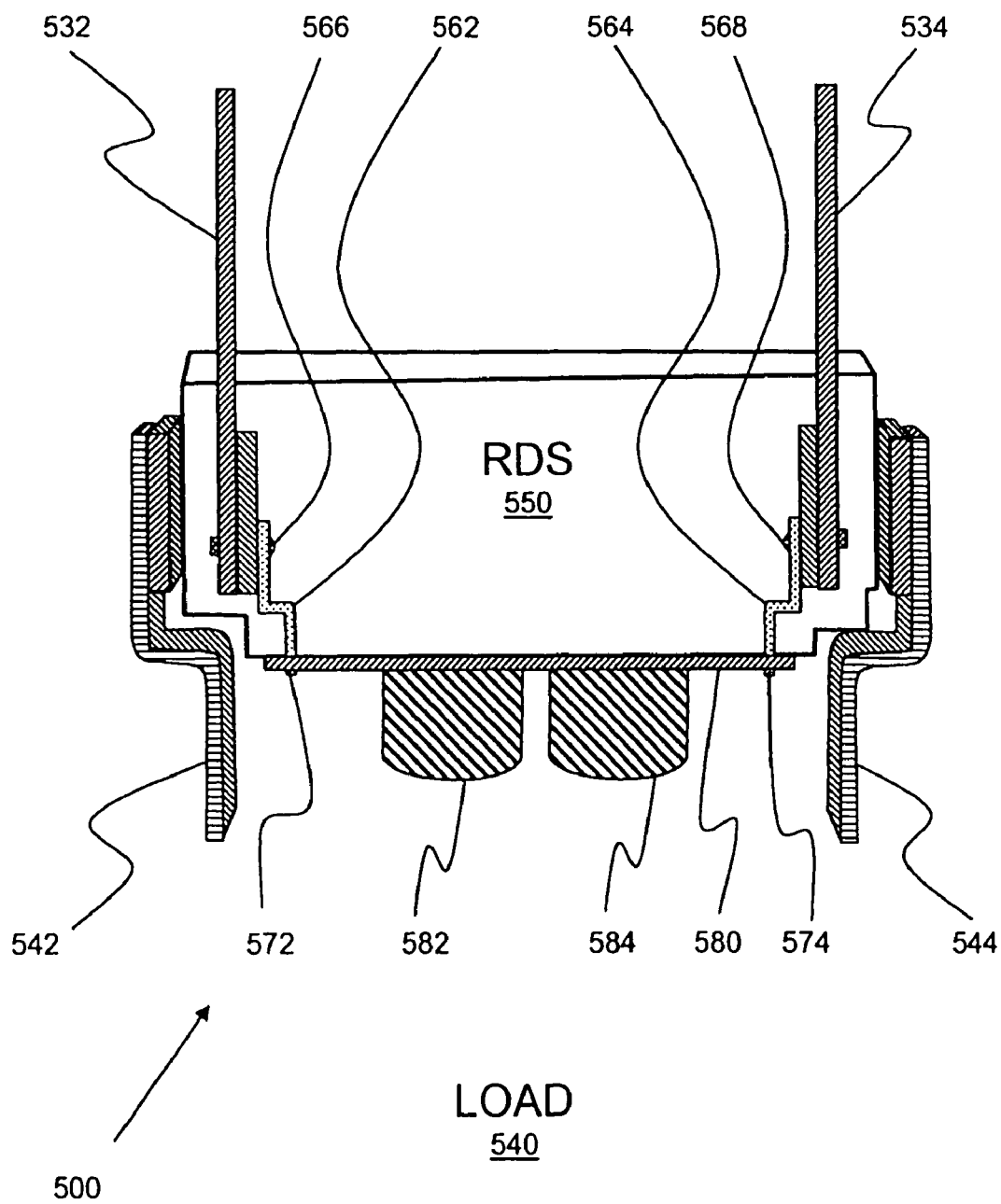
FIG. 5 illustrates for further disclosure purposes relating to present subject matter a side view of an exemplary line side terminal configuration providing line side voltage sensing for a watthour meter in accordance with the present subject matter.

With reference now to FIG. 5 there is illustrated a side view of an exemplary line side terminal configuration providing line side voltage sensing for a watthour meter in accordance with the present subject matter As illustrated, line side terminals 532, 534 of a meter generally 500 constructed in accordance with the present subject matter are provided. Line side terminals 532, 534 are configured to be inserted through the rear portion of a meter case (not illustrated) and may be plugged into a corresponding meter socket for coupling to a voltage supply line.

Line side terminals 532, 534 may be mechanically and electrically coupled to input terminals extending from Remote Disconnect Switch (RDS) 550 which, in turn, includes load side terminals 542, 544 extending from RDS 550 and may be coupled through additional conductive elements (not illustrated) to load side components (not illustrated). In an exemplary configuration, RDS 550 may correspond to the electrical switch device disclosed in U.S. Pat. No. 6,046,661 to Reger et al., the disclosure of which is incorporated herein for all purposes.

With further reference to FIG. 5, it will be noticed that there are provided a pair of terminals 562, 564 that are electrically and mechanically coupled to line side terminals 532, 534. Terminals 562, 564, in one exemplary configuration, may be secured at one end to line side terminals 532, 534 by way of rivets 564, 566. At second ends 572, 574, terminals 562, 564 may be sized to pass through vias in printed wiring board (PWB) 580 for electrical connection to circuit components exemplarily illustrated at 582, 584. In this manner and in accordance with the present subject matter, line side voltage may easily be sampled as previously described.

It should be appreciated that, although the presently illustrated exemplary embodiment shows the use of rivets to couple terminals 562, 564 to line side terminals 532, 534, those of ordinary skill in the art will understand that other coupling methodologies may be provided. For example terminals 562, 564 may be brazed or welded to line side terminals 532, 534. Alternatively, terminals 562, 564 may correspond to coined, integrated protrusions on the line side terminals themselves.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An electricity meter for use within an advanced metering system having and operating relative to a network, other meters, user interfaces, and central collection functionality, comprising:

a line side which receives electrical service when connected to said meter;

a load side, downstream from said meter line side, which electrically connects with an electrical load when connected to said meter;

a detection circuit, upstream from said meter load side and downstream from said meter line side, for detecting the presence of electricity at said meter load side;

a remote disconnect switch, upstream from said detection circuit and downstream from said meter line side, controllably actuated for electrically connecting and disconnecting said meter line side relative to said meter load side, so that electrical service when present at said meter line side is, respectively, electrically connected with, and disconnected from, an electrical load when present at said meter load side;

metrology, downstream from said meter line side and upstream from said meter load side, for monitoring the consumption or production of electricity vis-a-vis electrical service and electrical load associated with said meter; and a bidirectional communications link, linking said meter and a network operating relative to an advanced metering system, such that data may be communicated regarding actuation of said remote disconnect switch and presence of electricity at said meter load side;

wherein said detection circuit is configured to determine whether the presence of electricity has been detected at the meter load side after actuation of the remote disconnect to electrically disconnect the meter line side relative to the meter load side; and if the presence of electricity has been detected at the meter load side, to determine whether the phase angle of the line side voltage is the same as that of the load side voltage, so as to determine whether the source of electricity detected at the meter load side is different from that for the electrical service connected to the meter line side.

2. An electricity meter as in claim 1, wherein:

said detection circuit comprises a voltage sensor electrically in parallel with said meter load side; and said metrology includes current acquisition circuitry for receiving electrical service current signals, and voltage acquisition circuitry for receiving electrical service voltage signals.

3. An electricity meter as in claim 2, wherein:

said detection circuit includes a filtering capacitor, an overcurrent protection resistor, an opto-isolator, and a transient voltage suppressor for setting the turn-on voltage of said voltage sensor; and said current acquisition circuitry and said voltage acquisition circuitry are configured for receiving multi-phase electrical service current and voltage signals, respectively.

4. An electricity meter as in claim 1, wherein said bidirectional communications link includes at least one communications module configured to effect bi-directional communications between said meter and other networked devices using an open standard meter communication protocol, and said at least one communications module includes one of an additional circuit board dedicated to WAN connectivity and one or more of GPRS, Ethernet, and RF LAN communications modules.

5. An electricity meter as in claim 4, further including a pair of terminals, integrated into the bus work on said line side, and connected to said metrology, for monitoring of the line side voltage.

6. An electricity meter as in claim 1, wherein said metrology is configured for correction of any monitoring offset relative to electrical service caused by the presence of said detection circuit.

7. A methodology for improved functionality of an electricity meter used within an advanced metering system having and operating relative to a network, other meters, user interfaces, and central collection functionality, comprising:

providing an electricity meter having:

a line side for receiving electrical service;

a load side, downstream from the meter line side, for electrically connecting with an electrical load;

a detection circuit, upstream from the meter load side and downstream from the meter line side, for detecting the presence of electricity at the meter load side;

a remote disconnect switch, upstream from the detection circuit and downstream from the meter line side, for controllably actuating for electrically connecting and disconnecting the meter line side relative to the meter load side, so that electrical service when present at the meter line side is, respectively, electrically connected with, and disconnected from, an electrical load when present at the meter load side;

metrology, downstream from the meter line side and upstream from the meter load side, for monitoring the consumption or production of electricity vis-a-vis electrical service and electrical load associated with the meter; and a bidirectional communications link, linking the meter and a network operating relative to an advanced metering system;

connecting electrical service to the meter line side; and connecting an electrical load to the meter load side, such that data may be communicated across the network regarding actuation of the remote disconnect switch and presence of electricity at the meter load side;

wherein the methodology further comprises actuating the remote disconnect switch so as to electrically disconnect the meter line side relative to the meter load side; subsequently determining whether the presence of electricity has been detected at the meter load side; and if the presence of electricity has been detected at the meter load side, determining whether the phase angle of the line side voltage is the same as that of the load side voltage, so as to determine whether the source of electricity detected at the meter load side is different from that for the electrical service connected to the meter line side.

8. A methodology as in claim 7, further comprising:

actuating the remote disconnect switch so as to electrically disconnect the meter line side relative to the meter load side; and subsequently verifying that the remote disconnect switch electrically disconnected the meter line side relative to the meter load side.

9. A methodology as in claim 8, further comprising:

subsequent to verifying that the remote disconnect switch electrically disconnected the meter line side relative to the meter load side, actuating the remote disconnect switch so as to electrically re-connect the meter line side relative to the meter load side.

10. A methodology as in claim 7, further comprising:

actuating the remote disconnect switch so as to electrically connect the meter line side relative to the meter load side; and subsequently verifying that the remote disconnect switch electrically connected the meter line side relative to the meter load side.

11. A methodology as in claim 7, further comprising:
actuating the remote disconnect switch so as to electrically disconnect the meter line side relative to the meter load side; and
subsequently identifying possible user fraud by verifying the presence of electricity at the meter load side.

12. A methodology as in claim 7, wherein the detection circuit comprises a voltage sensor electrically in parallel with the meter load side, such detection circuit including a filtering capacitor, an over-current protection resistor, an opto-isolator, and a transient voltage suppressor for setting the turn-on voltage of the voltage sensor.

13. A methodology as in claim 7, wherein the metrology includes current acquisition circuitry for receiving electrical service current signals, and voltage acquisition circuitry for receiving electrical service voltage signals, with such current acquisition circuitry and voltage acquisition circuitry configured for receiving multi-phase electrical service current and voltage signals, respectively.

14. A methodology as in claim 7, wherein the bidirectional communications link includes at least one communications module configured to effect bi-directional communications between the meter and other networked devices using an open standard meter communication protocol, with such at least one communications module including an additional circuit board dedicated to WAN connectivity, or one or more of GPRS, Ethernet, and RF LAN communications modules.

15. A methodology as in claim 7, wherein the metrology is configured for correction of any monitoring offset relative to electrical service caused by the presence of the detection circuit.

16. Methodology for an advanced metering system with added functionality based on meter load side sensing, comprising:
providing a plurality of end devices, at least some of which end devices comprise electricity meters, each of such electricity meters having a line side for receiving electrical service; a load side, downstream from the meter line side, for electrically connecting with an electrical load; a detection circuit, upstream from the meter load side and downstream from the meter line side, for detecting the presence of electricity at the meter load side; a remote disconnect switch, upstream from the detection circuit and downstream from the meter line side, for controllably actuating for electrically connecting and disconnecting the meter line side relative to the meter load side, so that electrical service when present at the meter line side is, respectively, electrically connected with, and disconnected from, an electrical load when present at the meter load side; and metrology, downstream from the meter line side and upstream from the meter load side, for monitoring the consumption or production of electricity vis-a-vis electrical service and electrical load associated with the meter;
providing a network including central collection functionality;
configuring the network for bi-directional communications between the central collection functionality and each of the plurality of end devices;
connecting electrical service to the meter line side of at least one of such electricity meters; and connecting an electrical load to the meter load side of such at least one electricity meter, such that data may be communicated across the network regarding actuation of the remote disconnect switch thereof and presence of electricity at the meter load side thereof;
wherein the methodology further comprises actuating the remote disconnect switch so as to electrically disconnect the meter line side relative to the meter load side; subsequently determining whether the presence of electricity has been detected at the meter load side; and if the presence of electricity has been detected at the meter load side, determining whether the phase angle of the line side voltage is the same as that of the load side voltage, so as to determine whether the source of electricity detected at the meter load side is different from that for the electrical service connected to the meter line side.

17. Methodology as in claim 16, said method further comprises:
configuring selected of the plurality of end devices to relay bi-directional communications between the central collection functionality and others of the plurality of end devices; and
wherein establishing a network further includes:
providing at least one cell relay; and
configuring the network such that bi-directional communication between the central collection functionality and selected of the plurality of end devices passes through the at least one cell relay; whereby bi-directional communication between the central collection functionality and selected of the plurality of end devices is conducted by way of the cell relay
while bi-directional communication between the central collection functionality and others of the plurality of end devices is conducted directly; and
wherein configuring the network for bidirectional communications includes using an open standard meter communication protocol.

18. Methodology as in claim 16, further comprising:
actuating the remote disconnect switch of an electricity meter so as to electrically disconnect or connect the meter line side relative to the meter load side; and
subsequently verifying, respectively, that the remote disconnect switch electrically disconnected or connected the meter line side relative to the meter load side.

19. Methodology as in claim 16, wherein:
each detection circuit of an electricity meter comprises a voltage sensor electrically in parallel with the meter load side, such detection circuit including a filtering capacitor, an over-current protection resistor, an opto-isolator, and a transient voltage suppressor for setting the turn-on voltage of the voltage sensor;
the metrology of each electricity meter includes current acquisition circuitry for receiving electrical service current signals, and voltage acquisition circuitry for receiving electrical service voltage signals, with such current acquisition circuitry and voltage acquisition circuitry configured for receiving multi-phase electrical service current and voltage signals, respectively, and such metrology is configured for correction of any monitoring offset relative to electrical service caused by the presence of the detection circuit in such electricity meter; and
each electricity meter includes at least one communications module configured to effect bi-directional communications between the meter and other networked devices using an open standard meter communication protocol, with such at least one communications module including an additional circuit board dedicated to WAN connectivity, or one or more of GPRS, Ethernet, and RF LAN communications modules.

20. An advanced metering system with added functionality based on meter load side sensing, comprising:

a plurality of end devices, at least some of which end devices comprise electricity meters, each of such electricity meters having a line side for receiving electrical service; a load side, downstream from the meter line side, for electrically connecting with an electrical load; a detection circuit, upstream from the meter load side and downstream from the meter line side, for detecting the presence of electricity at the meter load side; a remote disconnect switch, upstream from the detection circuit and downstream from the meter line side, for controllably actuating for electrically connecting and disconnecting the meter line side relative to the meter load side, so that electrical service when present at the meter line side is, respectively, electrically connected with, and disconnected from, an electrical load when present at the meter load side; and metrology, downstream from the meter line side and upstream from the meter load side, for monitoring the consumption or production of electricity vis-a-vis electrical service and electrical load associated with the meter;

a network including central collection functionality, and configured for bi-directional communications between the central collection functionality and each of said plurality of end devices, such that data may be communicated across said network regarding actuation of the remote disconnect switch of an electricity meter and presence of electricity at the meter load side thereof;

wherein said detection circuit is configured to determine whether the presence of electricity has been detected at the meter load side after actuation of the remote disconnect to electrically disconnect the meter line side relative to the meter load side; and if the presence of electricity has been detected at the meter load side, to determine whether the phase angle of the line side voltage is the same as that of the load side voltage, so as to determine whether the source of electricity detected at the meter load side is different from that for the electrical service connected to the meter line side.

21. An advanced metering system as in claim 20, wherein: selected of said plurality of end devices are configured to relay bi-directional communications between the central collection functionality and others of said plurality of end devices; and wherein said network further includes at least one cell relay, with said bi-directional communication between the central collection functionality and selected of said plurality of end devices passing through the at least one cell relay, whereby bi-directional communication between the central collection functionality and selected of said plurality of end devices is conducted by way of the cell relay while bi-directional communication between the central collection functionality and others of the plurality of end devices is conducted directly; and wherein said network is configured for bi-directional communications includes using an open standard meter communication protocol.

22. An advanced metering system as in claim 20, wherein:

each detection circuit of an electricity meter comprises a voltage sensor electrically in parallel with the meter load side, said detection circuit including a filtering capacitor, an over-current protection resistor, an opto-isolator, and a transient voltage suppressor for setting the turn-on voltage of the voltage sensor;

the metrology of each electricity meter includes current acquisition circuitry for receiving electrical service current signals, and voltage acquisition circuitry for receiving electrical service voltage signals, with such current acquisition circuitry and voltage acquisition circuitry configured for receiving multi-phase electrical service current and voltage signals, respectively, and such metrology is configured for correction of any monitoring offset relative to electrical service caused by the presence of the detection circuit in such electricity meter; and each electricity meter includes at least one communications module configured to effect bi-directional communications between the meter and other networked devices using an open standard meter communication protocol, with such at least one communications module including an additional circuit board dedicated to WAN connectivity, or one or more of GPRS, Ethernet, and RF LAN communications modules.

* * * * *